United States Patent
Colli-Vignarelli et al.

(10) Patent No.: US 8,933,756 B2
(45) Date of Patent: Jan. 13, 2015

(54) IR-UWB TRANSMITTER

(75) Inventors: Edmund James Colli-Vignarelli, Les Avanchets (CH); Catherine Dehollain, Romanel sur Morges (CH); Jean-Yves Le Boudec, Prilly (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 346 days.

(21) Appl. No.: 13/495,827

(22) Filed: Jun. 13, 2012

(65) Prior Publication Data

US 2012/0319784 A1    Dec. 20, 2012

(30) Foreign Application Priority Data

Jun. 14, 2011  (WO) .................. PCT/IB2011/052579

(51) Int. Cl.
*H03K 3/03*  (2006.01)

(52) U.S. Cl.
USPC .............................. 331/57; 375/343; 327/294

(58) Field of Classification Search
USPC ................................. 331/57; 307/81; 375/343
See application file for complete search history.

(56) References Cited

U.S. PATENT DOCUMENTS

2009/0096292 A1*  4/2009  Ikeda ............................. 307/81

* cited by examiner

*Primary Examiner* — Joseph Chang
*Assistant Examiner* — Jeffrey Shin
(74) *Attorney, Agent, or Firm* — Nixon & Vanderhye P.C.

(57) ABSTRACT

A generator of very short pulses where a cascade of inverters of arbitrary length characterized in that said inverters are adapted to produce pulses on their power supply line instead of their usual output.

10 Claims, 3 Drawing Sheets

IR-UWB TRANSMITTER

This application claims priority to International Provisional Application No. PCT/IB2011/052579, filed Jun. 14, 2011, the entire contents of which are hereby incorporated by reference in their entirety.

FIELD OF THE INVENTION

The invention concerns Impulse-Radio Ultra-Wide Band (IR-UWB) transmitter architectures.

These architectures may be used for low bit rates such as 1 to 10 Mbps in the case of distributed wireless sensors or for high bit rate (several hundred Mbps) applications such as video transmission.

PRIOR ART

IR-UWB transmitters are notably disclosed in the following prior art:

[1] *Design and Analysis of a Compact UWB Pulse Generator With Programmable Pulse Shape*, Josuah D. Schwartz, José Azaña, Nicholas Zicha, David V. Plant, IEEE International Conference on Ultra-Wide Band 2009.

[2] *Distributed Waveform Generator: A New Circuit Technique for Ultra-Wideband Pulse Generation, Shaping and Modulation*, Yunliang Zhu, Member, IEEE, Jonathan D. Zuegel, John R. Marciante, and Hui Wu, Member, IEEE, IEEE JOURNAL OF SOLID-STATE CIRCUITS, VOL. 44, NO. 3, MARCH 2009.

[3] *Distributed Arbitrary Waveform Generator*, U.S. Pat. No. 7,545,304 B1, 9 Jun. 2009, Wu et al.

The IR-UWB transmitter architecture shown in FIG. 1, except for the addition of a transformer, corresponds to that which is described in the three prior art documents cited above.

A cascade of inverters delays the (squarewave low-frequency) excitation signal and NAND gates generate a pulse with the slight offset obtained between three consecutive gates. Each pulse is amplified with a cascade of five inverters that pull the line toward ground via a BALUN transformer the mid-point of which is at VCC. Each branch of the transformer is solicited alternately, which produces the positive and negative polarity of the signal, as well as the arithmetic sum of the basic pulses. The power is controlled by changing the voltage VCC of the transformer. Note that the inverters have a fixed and independent voltage in order to guarantee the stability of the centre frequency. The circuits of the three prior art documents cited above combine the output pulses directly whereas in the context of the FIG. 1 architecture a transformer is used for greater simplicity and accuracy.

DESCRIPTION OF THE INVENTION

The invention concerns a IR-UWB transmitter that is constituted of at least a first circuit and a second circuit, the first circuit comprising a base cell constituted of at least two inverters of which one is sufficiently large to produce the pulse of required amplitude and the other sufficiently small to have negligible consumption at the same time as being capable of driving the large one.

Figure 2:
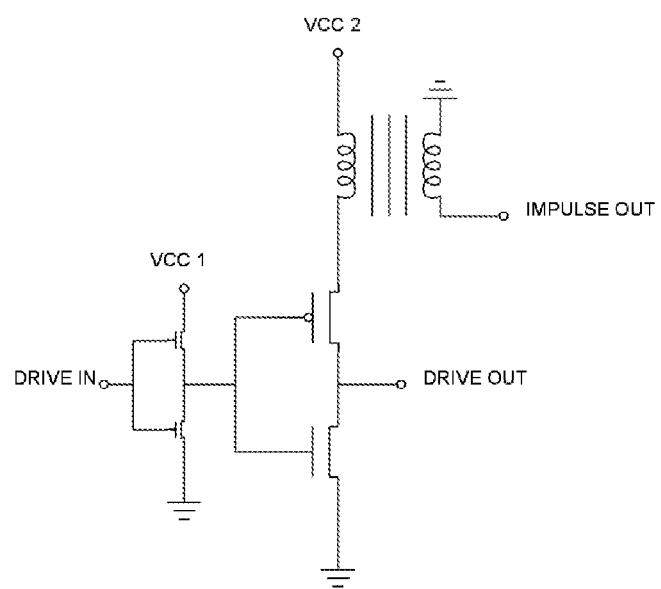
FIG. 2 represents one embodiment of a base cell of the invention.

FIG. 2 represents one embodiment of a base cell of the invention.

The drive signal (DRIVE IN) is any squarewave signal the only active characteristic of which is the moment of transition, which is responsible for creating the output pulse (IMPULSE OUT) that will constitute the useful UWB signal afterward. The output drive signal (DRIVE OUT) enables control of the next cell when a plurality of cells are cascaded. The IR-UWB transmitter of the invention is distinguished from those of the prior art notably by the fact that it exploits the secondary effect of the pulse in the power supply and not the output signal of the inverter itself; moreover, this approach means that each current point is employed efficaciously in terms of efficiency and thus there is virtually no loss, which makes it possible to minimize power consumption. Apart from a very low power consumption, this enables a circuit to be obtained of very high energy efficiency thanks to the fact that the signal is generated directly by the main power supply line.

The use of two inverters in the base cell offers at least the following three advantages:

1) Assuring that the polarity of the drive signal is maintained;
2) Assuring that the signal remains homogeneous along a cascade by using one small inverter to isolate two large ones;
3) Assuring that the parameters that control the signal at the level of a cell (the amplitude is controlled by VCC 2 and the delay is controlled by VCC 1) are indeed independent.

The second circuit is preferably (see the example shown in FIG. 3) constituted of a cascade of a plurality of cells (for example there are six of them in the case of illustration 3). Thus the second circuit is similar to the first, apart from the following essential fact: although the cascade generating the delay remains the same as in the first circuit (as well as the excitation signal), it is a transformer connected to the power supply of the cells that combines the pulses and confers on them the correct polarity for reconstructing the signal.

The cell and its use in cascade moreover make it possible to achieve perfect control over the fundamental three parameters of the signal: the power (amplitude), which is controlled by changing the power supply voltage (VCC) of the transformer; the centre frequency, which is modified by changing the power supply voltage of the intermediate inverters placed between two power inverters (variable Vcc1, Vcc2, Vcc3); and, finally, the bandwidth, which is modified by activating or deactivating a given number of cells (Vcc1, Vcc2, Vcc3 set to 0 or not). The order is as follows: the centre frequency is fixed by imposing the required Vcci ($1 <= i <= k$), after which the bandwidth is adjusted by setting to 0 the required Vcci ($k+1 <= i <= n$), and finally the intensity is adjusted by adjusting VCC.

The frequency of the excitation signal has no direct input on the generation of the output signal because the latter is generated only on changes of state of the former. In other words, it is the transitions of the excitation signal that have an effect and not the value of the signal itself. By a judicious choice of the duration of the high and low states of the excitation signal, this feature makes it possible to generate a high wide-band pulse rate at the output, even if the circuit that generates the excitation signal is slow compared to the circuit described here. In the particular case where the excitation signal is sufficiently fast, it is possible to have the pulses follow on in succession and thus to produce a signal that is virtually much longer than its natural duration as produced by the circuit after excitation.

In addition to the nonlimiting embodiments of the invention described above, there exist a great many other variants. A few of these variants are described hereinafter.

Figure 3:
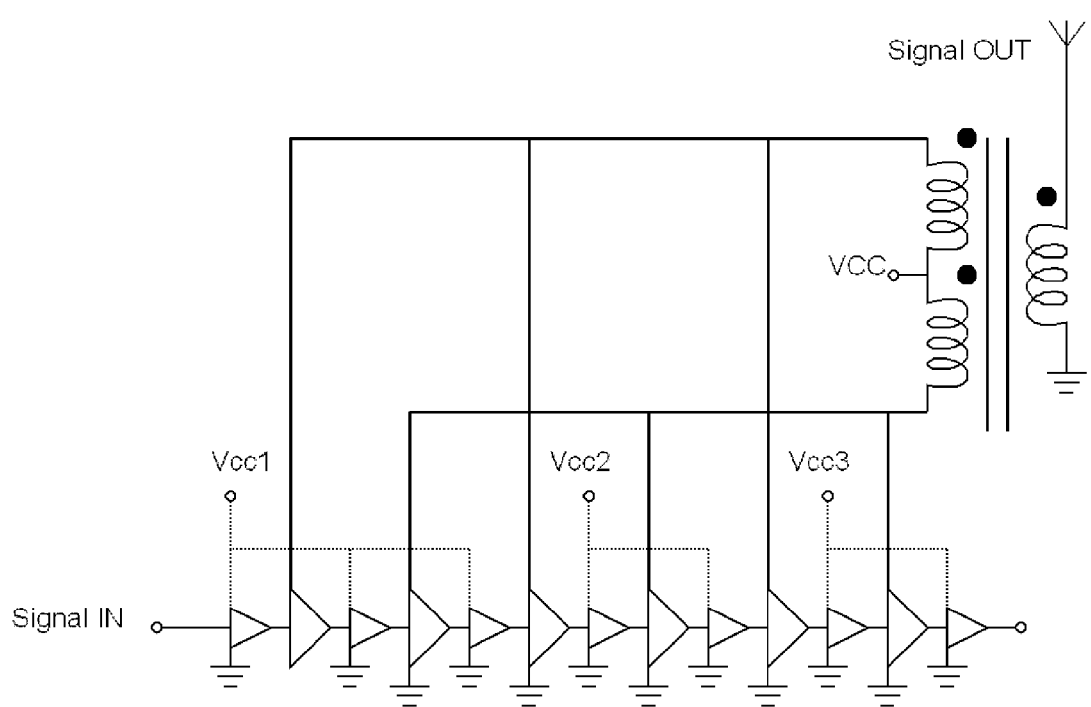
FIG. 3 represents a cascade of a plurality of cells.

A first variant consists in looping the cascade on itself to constitute a ring oscillator. For such an oscillator to start, an odd total number of inverters is required. For this reason, the number of inverters per cell must be at least three and the number of cells must be odd. If the cascade is not looped on itself, a capacitive load must be provided to terminate the cascade that is of the same value as the input capacitance of the first inverter in the cascade. The same inverter may be used as shown in FIG. 3 for example, or a capacitor of the correct value may be employed.

A second variant consists in a ring oscillator as described above but which generates a multiphase signal. The FIG. 3 circuit is a special case in which, thanks to the transformer, the cascade generates a two-phase signal (here with a phase shift of 180°) with positive and negative pulses alternating. The role of the transformer in assuring the polarity is rendered explicit in this example. Now, it is possible to generate a three-phase signal (120° phase-shift) or a signal having an arbitrary number of phases provided that that number is odd. In the case of an even number of phases, there is an even number of inverters in the ring oscillator and the latter is not able to start. In this particular case, it would be necessary to add an additional inverter to the cascade as described above with the drawback that the delay would not always be regular on this drive signal reaching this switch.

In the case of a linear cascade, the number of inverters per cell is of no importance and the choice will preferably be made to have only two of them.

Figure 1:
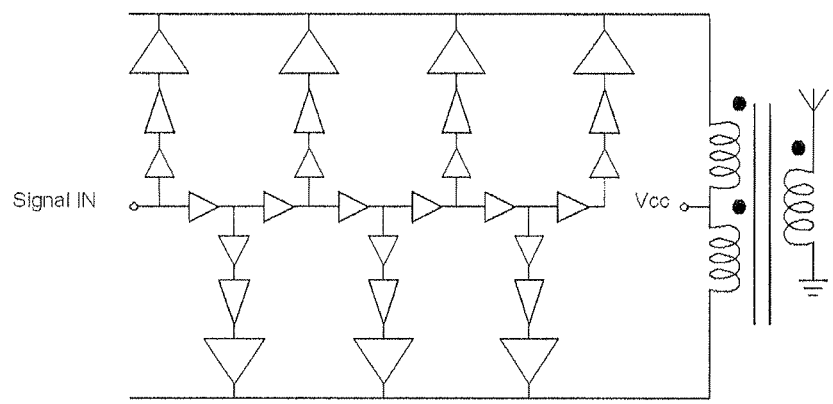
FIG. 1 represents an architecture using a transformer.

A third variant consists in having a plurality of primaries (or a single primary with a plurality of outputs) in the transformer in order to have different weightings of the signal as is possible with the FIG. 1 circuit.

A fourth variant consists in an open (non-loop) cascade in all respects similar to the original circuit but with an excitation signal the transitions whereof are synchronized to the travel time of the latter in the cascade. The effect obtained is a continuous signal similar to that obtained with the closed cascade of the ring oscillator. One constraint in this variant is the requirement for a circuit generating the excitation signal that is sufficiently fast to track the timing and also capable of being adjusted to enable synchronization of the pulse edges.

To summarize, the following considerations and elements apply to the invention:

It consists in a pulse generator that includes at least one cell as described above with an input signal for stimulating the generation of the signal;

A cell consists in at least two inverters, one of large size to produce the output signal via its power supply line and the other of small size to drive this large inverter;

The pulses are produced by the transitions of the excitation signal which are reflected in the power supply line of the large inverter;

The pulses produced on the power supply line are collected by a device such as a transformer for transferring, combining or weighting these pulses;

The cell may be cascaded in order to produce a succession of pulses spaced by a time determined by the supply voltage of the small inverter in the cell;

The cascade may be open (linear) to generate a signal in the form of pulses or closed (ring oscillator) to generate a periodic signal;

There may be three inverters in a cell to assure an odd number of inverters in a ring oscillator closed configuration;

The pulses may be combined by means of a device such as a transformer;

The use of a transformer makes it possible to weight the pulses by changing the number of turns of the primary;

The pulses may be combined by two, three or more channels to obtain two-phase, three-phase and multiphase signals, respectively;

The prior art cited above describes a circuit utilizing DACs to weight the output pulses and thus to construct an arbitrary signal; in the present invention, the signal is fixed in the architecture of the circuit; the spurious elements and the transient regimes that are associated therewith contribute to conferring on the signal a form that approximates the optimum form of the wide-band and low energy expenditure signal; the determination of the supposedly optimum signal is described in the paper: <<A Discrete-Components Impulse-Radio Ultra wide-Band (IR-UWB) Transmitter, James Colli-Vignarelli, Catherine Dehollain, IEEE Transactions on Microwave Theory and Techniques, Special issue on Ultrawide Band, 2011>>;

A transformer is employed to create the polarity from unipolar logic gates and to benefit from the maximum possible speed by optimizing the speed of the latter gate;

The signal is produced by combination of pulses produced by the power supply, in order to obtain a maximum efficiency of the circuit;

Intermediate gates the supply voltage of which is variable and independent of the main voltage are employed, on the one hand, to change the centre frequency of the signal and, on the other hand, to assure identical polarity from one stage to another;

The principal voltage is variable in order to enable adjustment of the power;

The design of the circuit enables a very high efficiency if the intermediate gates are of negligible size compared to the size of the power gates;

The design of the circuit enables total and independent control of the parameters (intensity, centre frequency, bandwidth) of the signal by the approach described in the aforementioned paper;

The design of the circuit offers the possibility of looping the chain and thus of having a ring oscillator, if required; it makes possible the special case where the rising and falling edges of the excitation signal are synchronized to the output signal generation time so as to double the duration thereof.

The invention claimed is:

1. A Pulse Generator comprising a cascade of inverters of arbitrary length characterized in that said inverters comprise an input, an output, and a power supply line and are adapted to produce pulses on the power supply line instead the output; and characterized in that the pulses produced on the power supply line are collected by a device such as a transformer for transferring, combining, or weighting the pulses, wherein said combination and weighting serving to create an arbitrary signal.

2. Pulse generator according to claim 1 and said cascade of inverters whereof is constituted of two types of inverters together forming a basic cell in which they alternate in the cascade: comprising a high power large inverter responsible for producing the pulse and a low power small inverter for driving the large inverters that follows it and for assuring an identical polarity for one stage to another.

3. Pulse generator according to claim 2 and said high power inverters whereof are sufficiently large to produce the pulse of required amplitude, said high-power inverters having a variable power supply voltage independent of the voltage of the small inverters in order to enable adjustment of the power of the pulse.

4. Pulse generator according to claim 2 and said low-power inverters whereof are sufficiently small to have a negligible power consumption at the same time as being capable of driving the subsequent larger inverter, said inverters having a variable power supply voltage independent of the voltage of the large inverters in order to modify the centre frequency of the signal.

5. Pulse generator according to claim 2 and characterized in that the output pulses are produced by the transitions of the input excitation signal that are reflected in the power supply line of said large inverters, in order to have a maximum efficiency of the circuit.

6. Pulse generator according to claim 2 and characterized in that the basic cell may be cascaded and sized to produce a succession of pulses spaced by a time determined by the power supply voltage of the small inverter in the cell.

7. Pulse generator according to claim 1 and characterized in that the cascade may be either open (linear) to generate a signal in the form of pulses or closed on itself (ring oscillator) to generate a periodic signal.

8. Pulse generator according to claim 2 and characterized in that there may be three inverters in a cell to assure an odd number of inverters in a ring oscillator closed configuration.

9. Pulse generator according to claim 1 and characterized in that the pulses are combined by two, three or more channels to obtain two-phase, three-phase and multiphase signals, respectively.

10. Pulse generator according to claim 1 and characterized in that the transformer is employed to create the polarity of the output signal from unipolar logic gates and thus to benefit from the maximum possible speed by optimizing the speed of the latter.

* * * * *